United States Patent [19]

Przybysz

[11] Patent Number: 4,555,845

[45] Date of Patent: Dec. 3, 1985

[54] TEMPERATURE STABLE SELF-PROTECTED THYRISTOR AND METHOD OF PRODUCING

[75] Inventor: John X. Przybysz, Penn Hills, Pa.

[73] Assignee: Westinghouse Electric Corp., Pittsburgh, Pa.

[21] Appl. No.: 434,192

[22] Filed: Oct. 13, 1982

[51] Int. Cl.[4] ............................................ H01L 21/66
[52] U.S. Cl. ........................................ 29/574; 29/580; 29/582; 29/583; 219/121 LJ; 357/38
[58] Field of Search ............... 29/574, 580, 581, 582, 29/583, 591; 219/121 LG, 121 LH, 121 LJ; 357/38, 20, 13

[56] References Cited

U.S. PATENT DOCUMENTS 4,047,219 9/1977 Temple ................................ 357/38

OTHER PUBLICATIONS

Przybysz, J. X. et al., "Thyristors with Overvoltage Self-Protection" in *1981 International Electron Device Meeting Technical Digest*, pp. 410–413.

*Primary Examiner*—Brian E. Hearn
*Assistant Examiner*—Alan E. Schiavelli
*Attorney, Agent, or Firm*—C. L. Menzemer

[57] ABSTRACT

The present invention is directed to a process for providing overvoltage protection to a thyristor and to the thyristor so protected and comprises contacting the space charge region of the forward blocking junction of the thyristor with an electrical contact when the predetermined switching voltage is reached.

6 Claims, 4 Drawing Figures

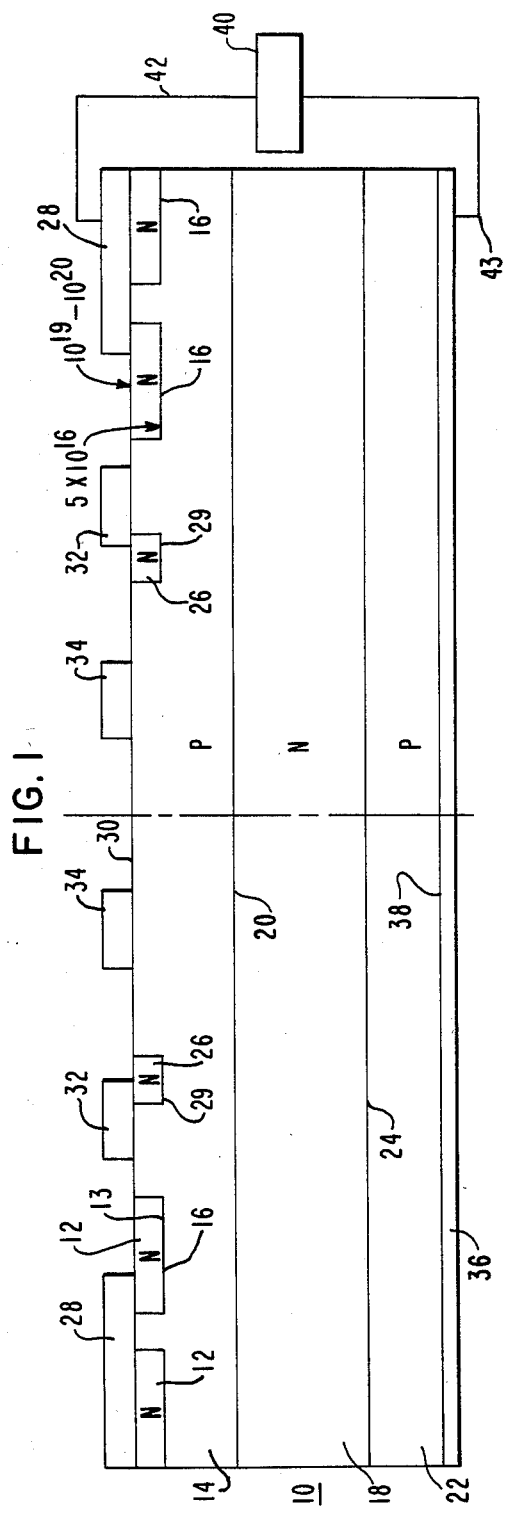
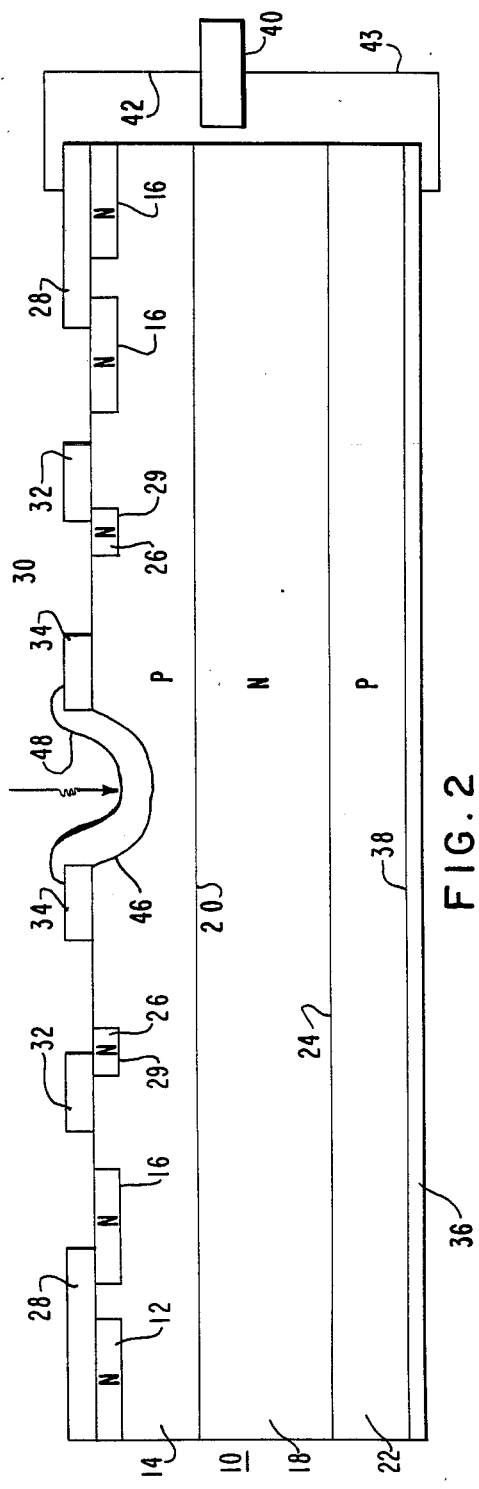

TEMPERATURE STABLE SELF-PROTECTED THYRISTOR AND METHOD OF PRODUCING

CROSS-REFERENCE TO RELATED APPLICATION

The present application is related to patent application Ser. No. 357,106 filed Mar. 11, 1982, now abandoned, the assignee of which is the same as the present application.

BACKGROUND OF THE INVENTION

1. Field of the Invention:

The present invention is in the field of power semiconductor devices generally and is directed to overvoltage protection of thyristors specifically.

2. Description of the Prior Art:

Typically overvoltage protection of a thyristor employs an avalanche current in the gate region to trigger the thyristor. The avalanching is achieved by etching a deep well, approximately 10 mils, in the gate region, during processing of a silicon wafer, the etching usually occurring after an aluminum diffusion and before a gallium diffusion is carried out. The avalanche voltage is determined by the depth and profile of the etched well.

The use of avalanching for self-protection will succeed or fail depending upon whether the avalanche voltage is less than or more than the edge breakdown voltage of the device.

The use of avalanching necessarily involves some derating of the electrical parameters of the device. Particularly, there is a derating of the forward blocking voltage, $V_{DRM}$, along with an attendant increase in forward drop, $V_F$, for the same $V_{DRM}$.

A major shortcoming of the prior art etched well protection system is the requirement that the well be formed relatively early in the wafer fabrication processing, before the blocking capability of the thyristor can be measured.

Another shortcoming of this prior art is the difficulty of controlling the subsequent gallium diffusion, after the etching of the well, to obtain the necessary curvature of the forward blocking junction.

The deep well prior art is discussed in "Thyristors With Overvoltage Self-Protection", J. X. Przybysz and E. S. Schlegel, 1981 IEDM, pgs. 410–413.

Two other prior art methods of overvoltage protection are (1) a thinned anode base for controlling $V_{BO}$ location and voltage level, and (2) using a curved forward blocking junction.

Both of these methods require building in the protection before the thyristor is completed and its parameters measured.

A deep well that results in avalanching at 2800 volts provides no protection to a thyristor which experiences edge breakdown at 2700 volts. On the other hand, a 2800 volt avalanche is too much derating for a thyristor which could block 3200 volts.

The deep well avalanche method leaves the process engineer the choice between high yield with greatly derated thyristors or a low yield with only slightly derated devices.

The curved junction technique frequently results in low yields due to the diffuculty in masking p-type diffusions.

The thin anode base and curved junction technique for achieving overvoltage protection are discussed in "Controlled Thyristor Turn-On For High DI/DT Capability", V. A. K. Temple, 1981 IEDM, pgs. 406–409.

The use of auxiliary thyristors and inhomogeneous or heterogeneous doping of the n-type base region is discussed in "A Thyristor Protected Against di/dt Failure At Breakdown Turn-On", P. Voss, Solid State Electronics, 1974, Vol. 17, pgs. 655–661.

U.S. Pat. No. 4,003,072 teaches curved junctions as a means of overvoltage protection.

"A New Bipolar Transistor-GAT", Hisao Kondo and Yoshinori Yukimoto, IEEE Transactions On Electronic Devices, Vol. Ed. 27 No. 2, Feb. 1980, pgs. 373–379 is a typical example of prior art teachings of a transistor in which the base region has portions extending deeper into the collector region than the remainder of the base region to contact the depletion region.

Application Ser. No. 190,699 filed Sept. 25, 1980, now abandoned, is an example of several applications filed in which the p-type base region of a thyristor has spacedapart portions extending into the n-type base region to contact the depletion region.

Application Ser. No. 357,106, filed Mar. 3, 1982, now abandoned, teaches providing overvoltage protection in a thyristor by pulsing the center of a gating region of a thyristor with a laser thereby deforming the blocking junction and resulting in a portion of the p-type base extending into the n-type base region.

SUMMARY OF THE INVENTION

The present invention is directed to a process for providing overvoltage self-protection in a thyristor, said thyristor being comprised of a cathode emitter region, a cathode base region, an anode base region and an anode emitter region, metal electrodes in ohmic electrical contact with said cathode emitter region, anode emitter region and one of said base regions, said process comprising forming a well in said one base region and disposing an electrical contact in said well, said metal contact being in an electrical contact relationship with said electrode in ohmic contact with said one base region.

The present invention also includes an overvoltage self-protected thyristor being comprised of a body of silicon, said body of silicon having a top surface, a bottom surface and an edge portion extending between said top and bottom surfaces, said thyristor being comprised of a cathode emitter region, a cathode base region, an anode base region and an anode emitter region, a p-n junction between adjacent regions, said cathode emitter region being segmented and extending from the top surface of said body into said body a predetermined first distance, said cathode base region extending from said top surface of said body, where it surrounds said segments of said cathode emitter region, into said body a predetermined second distance, said second distance being greater than said first distance, a central portion of said top surface being comprised of only said cathode base region, first metal electrodes disposed on said top surface of said body in ohmic electrical contact with both said cathode emitter region and said cathode base regions, a second ring-shaped metal electrode disposed centrally on the top surface of the body in ohmic electrical contact with only said cathode base region, walls of said cathode base region forming a well within said cathode base region, said well having side walls and a bottom surface, the well extending from the top surface of the body, and having its opening completely surrounded by said second ring-shaped electrode, into said cathode base region a predetermined distance, said predetermined distance being such that a space charge region of said p-n junction between said cathode base region and said anode base contacts the bottom surface of the well at a predetermined breakover voltage and a third metal electrode in an ohmic electrical contact relationship with at least the bottom surface of the well and the ring-shaped electrode disposed about the opening of the well on the top surface of the body.

BRIEF DESCRIPTION OF THE DRAWINGS

For a better understanding of the present invention, reference should be had to the following detailed description and drawings in which:

FIG. 1 is a side view in section of a thyristor prior to processing in accordance with the teachings of this invention;

FIG. 2 is a side view, in section of the thyristor of FIG. 1 after processing in accordance with the teachings of this invention.

DESCRIPTION OF PREFERRED EMBODIMENTS

Figure 4:
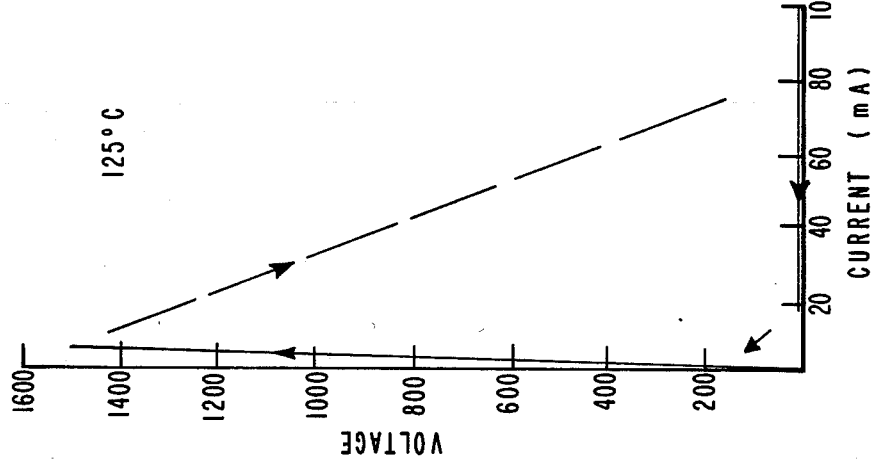
FIGS. 3 and 4 are I–V traces of the thyristor of FIG. 2 at 25° C. and 125° C.

With reference to FIG. 1, there is shown a thyristor 10.

The thyristor 10 is a typical thyristor known to those skilled in the art. The thyristor 10, comprised of silicon, has a segmented cathode emitter region 12 which is of N+ type conductivity doped to a surface concentration of from $10^{19}$ to $10^{20}$ atoms/cc and has a doping concentration of about $6 \times 10^{16}$ atoms/cc at its other major surface 13. Typically, the cathode emitter region 12 has a thickness of from 15 to 20 microns. There is a cathode base region 14 adjacent to the cathode emitter region. The cathode base region 14 is of p-type conductivity and doped to a surface concentration of from $5 \times 10^{17}$ to $10^{19}$ atoms/cc. Typically, the cathode base region has a thickness of from 70 to 90 microns. There is a p-n junction 16 between regions 12 and 14.

Adjacent to the cathode emitter base region 14 is an anode base region 18. The anode base region 18 is of n-type 55 ohm-cm conductivity. The thickness of the anode base region is dependent on the breakdown voltage capability desired for the thyristor. Typically, the anode base region will have a thickness of one micron for each 10 volts of breakdown voltage desired. A thickness of 230 microns is typical.

There is a p-n junction 20 between regions 14 and 18.

Anode emitter region 22 is adjacent to the anode base region 18. The anode emitter region 22 is of p+ type conductivity and is doped to a surface concentration of from $5 \times 10^{17}$ to $10^{19}$ atoms/cc. Typically, the anode base region has a thickness of from 70 to 90 microns and normally is of the same thickness as p-type region 14.

There is a p-n junction 24 between regions 18 and 22.

There is also an auxiliary emitter or floating gate region 26 formed in the cathode base region 14 and spaced apart from the cathode emitter region 12. The auxiliary emitter or floating gate region 26 is of n-type conductivity and doped to a surface concentration of from $10^{19}$ to $10^{20}$. There is a p-n junction 29 between regions 26 and 12.

An aluminum ohmic contact 28, referred to as an emitter contact, is affixed to, and in ohmic electrical contact with the segments of the cathode emitter regions 12 on top surface 30 of the thyristor 10 and is also in ohmic electrical contact with base region 14. This in effect electrically shorts regions 12 and 14.

A second aluminum ohmic contact 32 is affixed to the auxiliary emitter or floating gate region 26 on top surface 30 of the thyristor 10. The ohmic contact 32 is in ohmic electrical contact with both the auxiliary emitter region 26 and the cathode base region 14 and bridges the p-n junction 29 where the junction 29 intersects surface 30.

A circular or ring gate contact 34 is disposed on surface 30 in ohmic electrical contact with cathode base region 14.

The contacts 28, 32 and 34 all disposed on top surface 30 of the thyristor 10 are spaced apart from each other as shown in FIG. 1.

An anode emitter contact 36, preferably of molybdenum, is affixed to bottom surface 38 of the thyristor 10 in ohmic electrical contact with the anode emitter region 22.

It should be understood that the thyristor 10 of FIG. 1 is a finished thyristor.

In practicing the teaching of this invention, a curve tracer 40 is electrically connected between the cathode emitter contact 28 and the anode emitter contact 36 by electrical conductors 42 and 43, respectively. A suitable curve tracer is one sold commercially by Tektronix and designated as Curve Trace 576.

With the thyristor 10 connected to the curve tracer 40 the IV characteristic of the thyristor 10 is determined.

With reference to FIG. 2, a laser is then used to pulse the thyristor 10 at approximate the center of the cathode base region. The pulsing is carried out on top surface 30 between the ring gate contact 34 and results in the formation of a well 46 in the anode base region 14.

The IV characteristic of the thyristor is measured after each pulse or after a few pulses at the beginning and then after each pulse to determine the blocking voltage. The laser pulsing is continued until the desired blocking voltage is realized.

The laser used in practicing the present invention may be a YAG laser or a ruby laser.

With a YAG laser, pulse widths may vary from about one nanosecond to about one millisecond and energy per pulse from 70 to 80 millijoules. Energy per pulse may, however, be considerably less as for example as small as 3 to 15 millijoules.

With a ruby laser, pulse widths may vary from about 20 microseconds to about 1 millisecond with an energy per pulse of about 200 millijoules.

With a device such as described relative to FIG. 1, eighteen pulses of a YAG laser with an energy per pulse of 70 to 80 millijoules produced wells of from 44 to 47 microns deep.

The well 46 may also be formed by means other than a laser.

For example, wells have been formed by drilling or abrading using 1/16 inch to 1/32 inch diameter carbide bits powered by a 20,000 rpm air grinder. Wells have also been formed using a Comco Inc. Microabrasive Glove Box and forming the well by abrasive blasting as for example with 10 micron alumina powder propelled at 70 psi through an 18 mil nozzle.

Following the formation of the well, a piece of solder is disposed in the well and melted in situ. The quantity of solder used must be sufficient to cover the bottom of the well and extend up to and make contact with gate electrode 34.

The melting of the solder may be accomplished by heating with a $CO_2$ laser.

Upon re-solidification the solder 48 comprises an electrical contact between the bottom of the well and gate electrode or contact 34. The contact between the solder and the silicon, at the bottom of the well, may be an ohmic contact or a Schottky contact.

A suitable solder is one sold commercially under the designation Consil 970 which consists by weight 97% silver, 2% lead and 1% antimony.

Any suitable metal solder can be used as long as it makes good electrical contact to the silicon and the gate contact or electrode.

In operating the thyristor of this invention, prepared in accordance with the teachings of this invention, at the self-protected switching voltage, the spacecharge region of the forward blocking junction contacts the bottom of the well. The electrical fields, which are present in the space charge region, draw a current out of the solder contact 48, and this causes the thyristor to switch on. The switching occurs very abruptly, at a low current, and at a voltage which is stable with respect to temperature.

A thyristor of the type described in FIGS. 1 and 2 was fabricated.

The thyristor had a cathode emitter region doped to a surface concentration of $10^{20}$ atoms/cc. The cathode emitter region was 17 microns thick. The cathode base region and the anode emitter regions were each doped to a surface concentration of $8 \times 10^{17}$ atoms/cc and had a thickness of 75 microns. The doping concentration of the cathode emitter region at the interface with the cathode base region was $6 \times 10^{16}$ atoms/cc. The anode base region was doped to a concentration of $9 \times 10^{13}$ atoms/cc and had a thickness of 230 microns.

The thyristor was connected to a Tektronix 576 Curve Tracer as described above and pulsed with a YAG laser to form a well.

The pulse width was 100 microseconds and the energy per pulse was 70 millijoules.

After the eighteenth pulse, a sharp knee appeared in the current voltage characteristic at 1600 volts. The well at this point was 45 microns deep.

A 2 mil foil of the silver, lead antimony solder sold commercially as Consil 970, and described above, was disposed in the well and melted in situ using a $CO_2$ laser of 47 watt power focussed to a 20 mil diameter spot on the solder foil.

Figure 3:
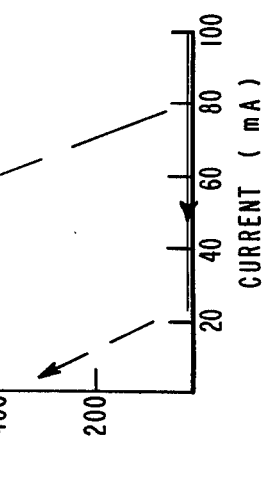

FIG. 3 shows the self-protected switching of this thyristor at about 1500 volts at room temperature, 25° C.

With reference to FIG. 4, the thyristor was heated to 125° C. and it can be seen that the thyristor still switched at 1500 volts with a low switching current.

This excellent temperature stability is attributable to the fact that no leakage currents are involved in generating the switching current.

I claim as my invention:

1. A process for providing overvoltage self protection in a thyristor, said thyristor having a top and a bottom surface, said thyristor being comprised of a cathode emitter region, a cathode base region, said cathode base region being adjacent to said cathode emitter region, an anode base region, said anode base region being adjacent to said cathode base region, and an anode emitter region, said anode emitter region being adjacent to said anode base region, pn junctions between adjacent regions, said cathode base region extending from said top surface into said thyristor a predetermined first distance, said cathode emitter region being segmented and extending from said top surface into said cathode base region a predetermined second distance, said predetermined first distance being greater than said predetermined second distance, metal electrodes in ohmic electrical contact with said cathode emitter region, anode emitter region and one of said base regions, said process comprising: connecting a means for measuring the IV characteristic of the thyristor between the anode emitter electrode and the cathode emitter electrode of the thyristor, forming a well in a central portion of said one base region while continuing to monitor the IV characteristic of the thyristor and affixing a metal electrical contact in an electrical contact relationship with at least the bottom of said well and the metal electrode in ohmic contact with said base region.

2. The process of claim 1 in which the well is formed with a laser.

3. The process of claim 1 in which the well is formed by drilling.

4. The process of claim 1 in which the well is formed by abrasive blasting.

5. The process of claim 1 in which the well is formed in the cathode base region by a YAG laser.

6. The process of claim 5 in which the contact is affixed to at least the bottom of the well and the electrode in ohmic contact with the cathode base region by melting a solder foil in situ with a $CO_2$ laser.

* * * * *